United States Patent
Yang et al.

(10) Patent No.: US 9,929,533 B2
(45) Date of Patent: Mar. 27, 2018

(54) OPTICAL MODULE

(71) Applicant: HISENSE BROADBAND MULTIMEDIA TECHNOLOGIES CO., LTD., Qingdao (CN)

(72) Inventors: Shihai Yang, Qingdao (CN); Qiang Zhang, Qingdao (CN); Qisheng Zhao, Qingdao (CN)

(73) Assignees: Hisense Broadband Multimedia Technologies Co., Ltd., Qingdao (CN); Hisense USA Corporation, Suwanee, GA (US); Hisense International Co., Ltd., Qingdao (CN)

( * ) Notice: Subject to any disclaimer, the term of this patent is extended or adjusted under 35 U.S.C. 154(b) by 0 days.

(21) Appl. No.: 15/387,947

(22) Filed: Dec. 22, 2016

(65) Prior Publication Data

US 2017/0104310 A1   Apr. 13, 2017

(30) Foreign Application Priority Data

Dec. 25, 2015   (CN) .......................... 2015 1 0984342

(51) Int. Cl.
  *H01S 5/042*   (2006.01)
  *H01S 5/00*    (2006.01)
  *H01S 5/50*    (2006.01)
  *H01S 5/062*   (2006.01)
  *H04B 10/00*   (2013.01)

(52) U.S. Cl.
  CPC ............ *H01S 5/042* (2013.01); *H01S 5/0085* (2013.01); *H01S 5/06213* (2013.01); *H01S 5/50* (2013.01); *H04B 10/00* (2013.01)

(58) Field of Classification Search
  CPC .......... H01S 5/0085; H01S 5/042; H01S 5/50; H01S 5/0265
  See application file for complete search history.

(56) References Cited

U.S. PATENT DOCUMENTS

| | | | |
|---|---|---|---|
| 8,593,725 B2* | 11/2013 | Kliner ....................... | H01S 3/11 359/337 |
| 2007/0065162 A1* | 3/2007 | Kikuchi ............. | H04B 10/2507 398/208 |
| 2011/0032605 A1* | 2/2011 | Kliner ....................... | H01S 3/11 359/344 |
| 2011/0157685 A1* | 6/2011 | Sugawara ................. | H01S 5/12 359/328 |

(Continued)

*Primary Examiner* — Eric L Bolda
(74) *Attorney, Agent, or Firm* — Harness, Dickey & Pierce, P.L.C.

(57) ABSTRACT

The present disclosure relates to the field of optical communication, particularly to an optical module. An optical module according to embodiments of the disclosure includes: a laser device including an emission region, and a modulation region to which light emitted by the emission region is transmitted; a bias circuit connected with the emission region, configured to drive the emission region to emit light at stable optical power; a modulation circuit connected with the modulation region, configured to drive the modulation region, so that the modulation region varies the optical power of the light emitted from the emission region; and a semiconductor optical amplifier configured to receive the light from the modulation region, and to vary the optical power of the light.

20 Claims, 3 Drawing Sheets

(56) References Cited

U.S. PATENT DOCUMENTS

| | | | |
|---|---|---|---|
| 2013/0170019 A1* | 7/2013 | Teranishi | H01S 5/06812 359/337.11 |
| 2014/0049810 A1* | 2/2014 | McComb | H01S 3/2333 359/341.1 |
| 2014/0072002 A1* | 3/2014 | Connolly | H01S 5/50 372/26 |
| 2014/0147119 A1* | 5/2014 | Watanabe | H04B 10/5051 398/76 |

* cited by examiner

OPTICAL MODULE

CROSS REFERENCE TO RELATED APPLICATION

This application claims the benefit and priority of Chinese Patent Application No. 201510984342.6 filed Dec. 25, 2015. The entire disclosure of the above application is incorporated herein by reference.

FIELD

The present disclosure relates to the field of optical communications, and particularly to an optical module.

BACKGROUND

This section provides background information related to the present disclosure which is not necessarily prior art.

In an optical communication network, an optical module converts an electrical signal into an optical signal. Particularly power supply control on a laser device in the optical module is performed to thereby control the light emission state of the laser device so as to load information carried in the electrical signal onto the optical signal.

However in the relevant art, the information loaded onto the optical signal is only single branch of information to be transmitted, thus limiting the bandwidth of optical communication.

SUMMARY

This section provides a general summary of the disclosure, and is not a comprehensive disclosure of its full scope or all of its features.

Some embodiments of the disclosure provide an optical module so as to carry two branches of information over an optical signal transmitted by a laser device.

In order to attain the object above, some embodiments of the disclosure provide the following technical solutions:

An optical module includes:

a laser device including an emission region, and a modulation region to which light emitted by the emission region is transmitted;

a bias circuit connected with the emission region, configured to drive the emission region to emit light at stable optical power;

a modulation circuit connected with the modulation region, configured to drive the modulation region, so that the modulation region varies the optical power of the light emitted from the emission region; and a semiconductor optical amplifier configured to receive the light from the modulation region, and to vary the optical power of the light emitted from the modulation region.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Figure 1:
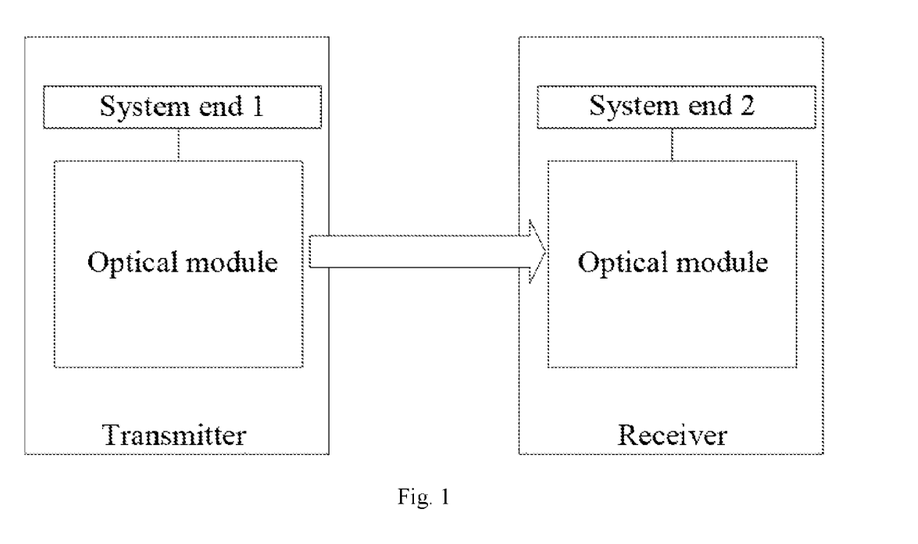
FIG. 1 is a schematic diagram of interactive optical communication in the relevant art.

An optical module is an electrical-optical and optical-electrical conversion device, and optical communication through the optical module is interactive communication. FIG. 1 is a schematic diagram of interactive optical communication in the relevant art. As illustrated in FIG. 1, at a transmitter, an optical module is connected with a system end 1, such as a switch or the like, and configured to receive an electrical signal from the system end 1, to convert the electrical signal into an optical signal, and to output the optical signal, which is generally input into an optical waveguide, e.g. optical fiber, to thereby transmit information; and at a receiver, an optical module is connected with a system end 2, such as a switch or the like, to receive the optical signal from the transmitter, then to convert the optical signal into an electrical signal, and to output the electrical signal to the system end 2, where common system ends include switches, optical network element set-top boxes, optical line terminal set-top boxes, etc.

At the transmitter, the optical module drives the in-built laser device to emit light to thereby convert the electrical signal into the optical signal. The system end characterizes the information to be transmitted, as the varying electrical signal, and outputs the electrical signal to the optical module, where the electrical signal may be a voltage signal or a current signal. The optical module drives the laser device according to the varying electrical signal to emit light, so that the laser device emits light at optical power varying with the varying electrical signal, where the light at the varying optical power carries information.

Figure 2:
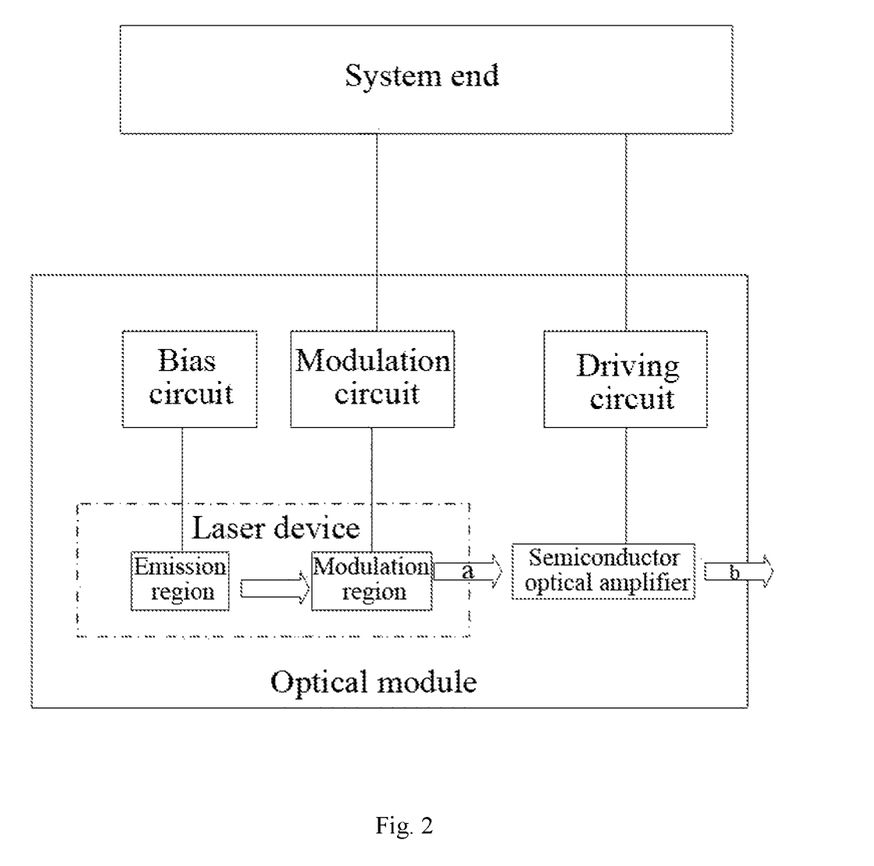
FIG. 2 is a schematic structural diagram of an optical module according to some embodiments of the disclosure.

FIG. 2 is a schematic structural diagram of an optical module according to some embodiments of the disclosure. As illustrated in FIG. 2, an optical module includes a laser device including an emission region, and a modulation region to which light emitted by the emission region is transmitted; a bias circuit connected with the emission region, and configured to drive the emission region to emit the light at stable optical power, wherein the stable optical power means that the optical power of the light emitted from the emission region is in a preset interval; a modulation circuit connected with the modulation region, and configured to drive the modulation region, so that the modulation region varies the optical power of the light transmitted from the emission region; and a driving circuit, one end of which connected with a system end, and the other end of which connected with a semiconductor optical amplifier. The semiconductor optical amplifier connected with the driving circuit receives the light from the modulation region, and is driven by the driving circuit to vary the optical power of the light transmitted from the modulation region.

In embodiments of the disclosure, the light emission region emits a first light with stable optical power; the modulation region receives the first light and changes the optical power of the first light to generate a second light, and outputs the second light to the semiconductor optical amplifier; the semiconductor optical amplifier receives the second light and changes the optical power of the second light to generate a third light. The modulation region changes the optical power of the first light in accordance with a signal transmitted by the modulation circuit, and the semiconductor optical amplifier changes the optical power of the second light according to a signal transmitted by the driving circuit. When the frequency of the signal transmitted by the modulation circuit and the frequency of the signal transmitted by the driving circuit are different, the third light carries two branches of information.

Information can be loaded onto the light by varying the optical power of the light. The embodiments of the disclosure provide the optical module, where the modulation circuit drives the modulation region to vary the optical power of the light transmitted from the emission region to thereby load a first branch of information onto the light; and the semiconductor optical amplifier receives the light from the modulation region, and varies the optical power of the light transmitted from the modulation region to thereby load a second branch of information onto the light.

The bias circuit drives the emission region of the laser device to emit the light at the stable optical power, where the bias circuit performs the driving function without being controlled by the system end, the emission region is driven by the optical module itself, and both the modulation region of the laser, and the semiconductor optical amplifier are fundamentally driven by the system end. The system end is electrically connected with the optical module through a connection component, e.g., Golden Finger, etc., and signals are transmitted by the system end to the modulation circuit and the driving circuit to control the modulation region and the semiconductor optical amplifier respectively.

The emission region of the laser device is commonly a laser diode which converts a system signal together with the bias circuit and the modulation circuit. The bias circuit drives the emission region to emit the light at the stable optical power, and the modulation circuit converts a first amplitude-varying signal of the system end into a first driving signal, i.e., varying current or varying voltage, so that the power of the light output by the modulation region varies accordingly, thus converting the electrical signal into the optical signal for the purpose of loading signal onto the light at the stable optical power emitted by the emission region of the laser device. By way of an example, if there is a different received signal from the system end, then the first driving signal output by the modulation circuit will also vary accordingly, so that the power of the optical signal output by the modulation region is varied.

Along with a constantly growing level of integration in a product, the emission region, the modulation region, and the semiconductor optical amplifier can be integrated in the same package structure, resulting in such a structure of the laser device that includes the emission region, the modulation region, and the semiconductor optical amplifier.

The bias circuit, the modulation circuit, and the driving circuit can also be integrated in the same chip.

Another optical module according to some embodiments of the disclosure includes a laser device driving chip in which a bias circuit and a modulation circuit are integrated, where the laser device driving chip is electrically connected with a system end.

The laser device includes a emission region and a modulation region, where the emission region emits such light at a single wavelength that is transmitted to the modulation region, and the modulation region receives the light transmitted by the emission region, and varies the optical power of the received light in a number of ways, which commonly include Distributed Feed Back (DFB), electrical absorption, semiconductor amplifier, etc.

The laser device as mentioned in the embodiments of the disclosure refers to an externally modulated laser device, common externally modulated laser devices include an EML laser device, an MZ laser device, and an SOA laser device. An emission region of the EML laser device is a DFB laser device, a modulation region of the EML laser device is an electrically absorbing semiconductor optical modulator EA, a modulation region of the SOA laser device is a semiconductor laser amplifier SOA, and a modulation region of the MZ laser device is an MZ modulating arm A system end device operating with the optical module according to the embodiments of the disclosure can operate in a burst mode, where the laser device is modulated in an amplitude modulation mode.

The emission region needs to be provided with current satisfying a specific required magnitude, so that the emission region can emit the light. The current satisfying the specific required magnitude is typically referred to as threshold current of the laser device. The bias circuit provides the emission region with the current satisfying the light emission requirement thereof to thereby drive the emission region to emit the light. The emission region is driven by the bias circuit to emit the light at the stable optical power. Generally the emission region is provided with a stable current magnitude, so that the emission region can emit the light at the stable optical power. However since some characteristic of the emission region, e.g., the threshold current of the semiconductor laser device, varies with the varying temperature, the current magnitude provided for the emission region may not be stable over a long period of time, so that the current magnitude will vary with the varying factors, such as temperature of the emission region, etc.

The modulation circuit connected with the modulation region of the laser device drives the modulation region, so that the optical power of the light emitted by the emission region is varied after the light enters the modulation region for the purpose of loading the signal onto the light at the stable light power emitted by the emission region of the laser device.

The system end converts the different information into two branches of different electrical signal, that is, the first amplitude-varying signal and the second amplitude-varying signal are input into the optical module for conversion and transmission of the signals. Since the contents of a signal being transmitted in the form of an electrical signal are carried in the fluctuating electrical signal, which may be a fluctuating voltage signal or a fluctuating current signal.

The modulation circuit receives the first amplitude-varying signal from the system end, converts the received first amplitude-varying signal into the first driving signal, and outputs the first driving signal to the modulation region of the laser device, so that the modulation region of the laser device is driven by the first driving signal.

The first amplitude-varying signal received by the modulation circuit from the system end may be a voltage signal or a current signal.

In reality, the modulation region of the laser device may be driven by a current signal or a voltage signal. If the modulation region of the laser device is driven by a current signal, then the first driving signal received by the modulation region of the laser device will be a current signal. If the modulation region of the laser device is driven by a voltage signal, then the first driving signal received by the modulation region of the laser device will be a voltage signal.

Furthermore while the modulation circuit is converting the first amplitude-varying signal of the system end into the first driving signal, the frequency of the signal may or may not change. Stated otherwise, while the modulation circuit is converting the first amplitude-varying signal of the system end into the first driving signal, if the frequency of the signal changes, then the frequency of the first amplitude-varying signal will be different from the frequency of the first driving signal; and if the frequency of the signal does not change, then the frequency of the first amplitude-varying signal will be the same as the frequency of the first driving signal.

The driving circuit receives the second amplitude-varying signal from the system end, converts the received second amplitude-varying signal into a second driving signal, and outputs the second driving signal to the semiconductor optical amplifier, so that the semiconductor optical amplifier is driven to vary the optical power of the light output by the semiconductor optical amplifier.

Here the second amplitude-varying signal received by the driving circuit from the system end may be a voltage signal or a current signal.

In reality, the semiconductor optical amplifier may be driven by a current signal or a voltage signal. If the semiconductor optical amplifier is driven by a current signal, then the second driving signal received by the semiconductor optical amplifier will be a current signal. If the semiconductor optical amplifier is driven by a voltage signal, then the second driving signal received by the semiconductor optical amplifier will be a voltage signal.

Furthermore while the driving circuit is converting the second amplitude-varying signal of the system end into the second driving signal, the frequency of the signal may or may not change. Stated otherwise, while the driving circuit is converting the second amplitude-varying signal of the system end into the second driving signal, if the frequency of the signal changes, then the frequency of the second amplitude-varying signal will be different from the frequency of the second driving signal; and if the frequency of the signal does not change, then the frequency of the second amplitude-varying signal will be the same as the frequency of the second driving signal.

The driving circuit converts the second amplitude-varying signal of the system end into the second driving signal, i.e., varying current or voltage, so that the power of the light output by the semiconductor optical amplifier varies accordingly, thus converting the electrical signal into the optical signal for the purpose of loading the two branches of signals onto the light at the stable optical power emitted by the emission region of the laser device. By way of an example, if there is a different received signal from the system end, then the second driving signal output by the driving circuit will also vary accordingly, so that the power of the optical signal output by the semiconductor optical amplifier is varied.

The optical module is a signal conversion device controlled by the system end to emit the optical signal according to the electrical signal from the system end, where the optical module converts the signal according to the electrical signal of the system end.

In the optical module, the modulation circuit connected with the system end receives the first amplitude-varying signal from the system end, the first amplitude-varying signal may be a voltage signal embodying the information, and the varying amplitude of the voltage signal is embodied as a fluctuating level thereof; and the modulation circuit outputs the current with the magnitude thereof varying in synchronization with the fluctuating level. The modulation circuit generates the current signal output to the modulation region, according to the voltage signal of the system end, where the voltage signal is converted into the current signal by a transconductance amplifier. The modulation circuit includes the transconductance amplifier including one end connected with the system end to receive the voltage signal from the system end, and the other end connected with the modulation region to provide the modulation region with the current signal.

In the optical module, the modulation circuit connected with the system end receives the first amplitude-varying signal from the system end, the first amplitude-varying signal is a current signal embodying the information, and the varying amplitude of the current signal is embodied as a fluctuating current magnitude; and the modulation circuit amplifies the received current signal and then outputs the amplified current signal to the modulation region.

The emission region is driven by the bias circuit to emit the light at the stable optical power, the light emitted by the emission region is transmitted to the modulation region, and the modulation region is driven by the current output by the modulation circuit; and since the magnitude of the current output by the modulation circuit varies with the voltage signal embodying the information, the modulation region has the optical power of the light emitted from the emission region varied with the varying current, so that information is embodied by the light at the varying optical power, that is, there is one branch of information loaded onto the light.

The semiconductor optical amplifier receives the light from the modulation region, and varies the optical power of the light emitted from the modulation region, so that the second branch of information is loaded onto the light.

In the optical module, the semiconductor optical amplifier is connected with the system end through the driving circuit, and the driving circuit receives the second amplitude-varying signal from the system end, and drives the semiconductor optical amplifier according to the second amplitude-varying signal. The second amplitude-varying signal is a voltage signal embodying the information, and the varying amplitude of the voltage signal is embodied as a fluctuating level thereof; the driving circuit converts the voltage signal into a current signal; and the semiconductor optical amplifier receives the current with the magnitude thereof varying in synchronization with the fluctuating level. The voltage signal is converted into the current signal by a transconductance amplifier. The driving circuit includes the transconductance amplifier including one end connected with the system end to receive the voltage signal from the system end, and the other end connected with the semiconductor optical amplifier to provide the semiconductor optical amplifier with the current signal.

The emission region is driven by the bias circuit to emit the light at the stable optical power, and on this basis, the modulation circuit outputs modulating current to thereby drive the modulation region to vary the optical power of the light emitted from the emission region; and since the magnitude of the current varies with the voltage signal embodying the information, the modulation region has the optical power of the light varied with the varying modulating current, so that the information is embodied by the light at the varying optical power, that is, there is one branch of information loaded onto the light.

The bias circuit outputs the current signal at the stable amplitude to the emission region; the modulation circuit outputs the current signal at the varying amplitude to the modulation region; and the driving circuit outputs the current signal at the varying amplitude to the semiconductor optical amplifier. The emission region and the modulation region in the laser device are current controlled devices to be driven by offered current.

A digital signal in existing optical communication is typically simulated by varying optical power, where the digital signal is typically represented as a binary signal. In an implementation, digits "0" and "1" in the digital signal is characterized by low and high optical power, and sorting of the digits "0" and "1" is characterized by controlling the periods of time for which the optical power is low and high. The bias circuit provides the emission region with the current to thereby drive the emission region to emit the light at the stable optical power, where the digits "0" and "1" can not be characterized by such light at the constant optical power; and the modulation circuit drives the modulation region to thereby vary the optical power of the light emitted from the emission region, that is, the emission region separately driven by the bias circuit is additionally driven by the modulation circuit, where the emission region emits the light at the stable optical power, which is transmitted to the modulation region, so that the modulation region receives the light at the stable optical power, and is driven by the modulation circuit to vary the optical power of the light at the stable optical power. The digits "0" and "1" in the digital signal can be characterized by the light at the low and high optical power; and the modulation circuit enables the modulation region to vary the optical power of the light at the stable optical power, that is, the modulation region receives the light at the stable optical power emitted by the emission region, and varies the optical power thereof, so that the digits "0" and "1" in the digital signal can be characterized by such light at the low and high optical power.

The light emitted by the emission region is transmitted to the modulation region, and the light passing the modulation region is transmitted to the semiconductor optical amplifier. The semiconductor optical amplifier receives the light at the varying optical power, i.e., the light onto which the information has been loaded. Further to this, the semiconductor optical amplifier is driven by the driving current output by the driving circuit to vary the optical power of the light transmitted from the modulation region, so that the second branch of information is loaded onto the light.

Figure 3:
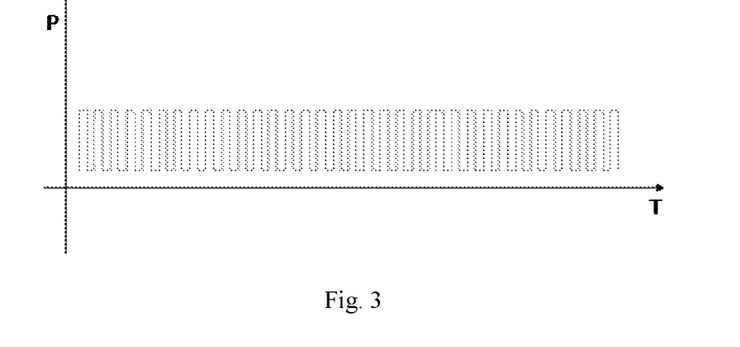
FIG. 3 is a schematic diagram of the magnitude of optical power output by the optical module in the relevant art.

FIG. 3 is a schematic diagram of the magnitude of the optical power output by the optical module in the existing art. As illustrated in FIG. 3, the optical module emits the light at the optical power varying over time, where the highest optical power of the light remains substantially constant, and the lowest optical power of the light remains substantially constant. The information is optically passed according to the correspondence relationship between the time and the optical power.

Here the optical signal illustrated in FIG. 3 can be generated as follows: if the modulation region of the laser device outputs the optical signal at the lowest power, then the modulation region of the laser device will be driven by the first driving signal to amplify the optical signal output by the emission region of the laser device using an amplification coefficient a1 (where a1 can be 0), and if the modulation region of the laser device outputs the optical signal at the highest power, then the modulation region of the laser device will be driven by the first driving signal to amplify the optical signal output by the emission region of the laser device using an amplification coefficient a2, so that the modulation region of the laser device amplifies the optical signal output by the emission region of the laser device using the amplification coefficients a1 and a2 alternately, thus resulting in the optical signal illustrated in FIG. 3.

Figure 4:
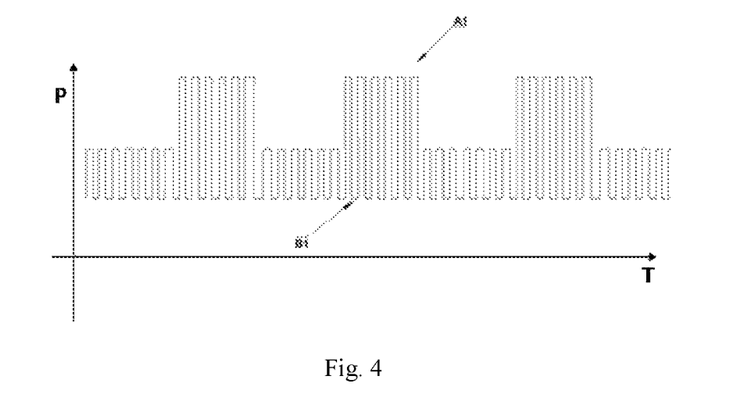
FIG. 4 is a schematic diagram of the magnitude of optical power output by the optical module according to some embodiments of the disclosure.

FIG. 4 is a schematic diagram of the magnitude of optical power output by the optical module according to an embodiment of the disclosure. As illustrated in FIG. 4, the optical module emits the light at the optical power varying over time, where the lowest optical power of the light remains substantially constant, and the highest optical power thereof significantly varies. Different information carried by a curve A1 and a curve B1 can be obtained by analyzing the curve A1 and the curve B1 over different temporal spans, where the curve A1 represents a digital signal, and the curve B1 represents a digital signal.

Here the optical signal illustrated in FIG. 4 can be generated as follows: firstly the modulation region can be driven to output the optical signal similar to the optical signal illustrated in FIG. 3 for the purpose of carrying one branch of information B1 over the optical signal, similarly to the way in which the optical signal illustrated in FIG. 3 is generated as described above; and then the semiconductor optical amplifier is driven by the second driving signal to amplify the optical signal output by the modulation region of the laser device using amplification coefficients b1 and b2 alternatively, thus resulting in the optical signal illustrated in FIG. 4 for the purpose of carrying the two branches of information (A1 and B1) over the optical signal.

The receiver receiving the optical signal illustrated in FIG. 4 can convert the light at the varying optical power into the electrical signal with the varying current magnitude using the photo-electric effect, and process the electrical signal into the two incoming branches of information (A1 and B1).

Figure 5:
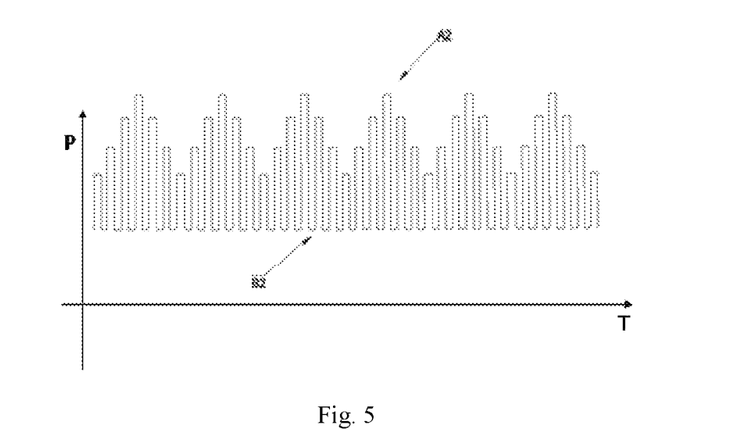
FIG. 5 is a schematic diagram of the magnitude of optical power output by another optical module according to some embodiments of the disclosure.

FIG. 5 is a schematic diagram of the magnitude of optical power output by another optical module according to an embodiment of the disclosure. As illustrated in FIG. 5, the optical module emits the light at the optical power varying over time, where the lowest optical power of the light remains substantially constant, and the highest optical power thereof significantly varies. Different information carried by a curve A2 and a curve B1 can be obtained by analyzing the curve A2 and the curve B2 over different temporal spans, where the curve A2 represents an analog signal, and the curve B2 represents a digital signal.

Here the optical signal illustrated in FIG. 5 can be generated as follows: firstly the modulation region can be driven to output the optical signal similar to the optical signal illustrated in FIG. 3 for the purpose of carrying one branch of information B2 over the optical signal, similarly to the way in which the optical signal illustrated in FIG. 3 is generated as described above; and then the semiconductor optical amplifier is driven by the second driving signal to amplify the optical signal output by the modulation region of the laser device using a periodically varying amplification coefficient, thus resulting in the optical signal illustrated in FIG. 5 for the purpose of carrying the two branches of information (A2 and B2) over the optical signal.

The receiver receiving the optical signal illustrated in FIG. 5 can convert the light at the varying optical power into the electrical signal with the varying current magnitude using the photo-electric effect, and process the electrical signal into the two incoming branches of information (A2 and B2).

In an implementation, the frequency of the second driving signal provided by the driving circuit to the semiconductor optical amplifier may be lower or higher than the frequency of the first driving signal provided by the modulation circuit to the modulation region.

The frequency of the second driving signal is lower than the frequency of the first driving signal, for example, the frequency of the first driving signal is higher than 1 Gbps, and the frequency of the second driving signal is lower than 1 Gbps.

By way of an example, the frequency of the first driving signal is 12.5 Gbps, and the frequency of the second driving signal is 100 Kbit/s.

If the modulation circuit generates the first driving signal according to the first amplitude-varying signal without varying the frequency of the signal, and also the driving circuit generates the second driving signal according to the second amplitude-varying signal without varying the frequency of the signal, then the magnitude relationship between the frequency of the first amplitude-varying signal, and the frequency of the second amplitude-varying signal will be the same as the magnitude relationship between the frequency of the first driving signal, and the frequency of the second driving signal.

If the modulation circuit generates the first driving signal according to the first amplitude-varying signal while varying the frequency of the signal, or the driving circuit generates the second driving signal according to the second amplitude-varying signal while varying the frequency of the signal, then the frequency of the first amplitude-varying signal from the system end will be different from the frequency of the second amplitude-varying signal from the system end, for example, the frequency of the first amplitude-varying signal is higher than the frequency of the second amplitude-varying signal, or the frequency of the first amplitude-varying signal is lower than the frequency of the second amplitude-varying signal.

The frequency of the first amplitude-varying signal is higher than the frequency of the second amplitude-varying signal, for example, the frequency of the first amplitude-varying signal is higher than 1 Gbps, and the frequency of the second amplitude-varying signal is lower than 1 Gbps.

In the optical module according to the embodiments of the disclosure, the modulation circuit drives the modulation region to vary the optical power of the light emitted from the emission region according to the first amplitude-varying signal of the system end, so that the first branch of information is loaded onto the light; and the semiconductor optical amplifier receives the light from the modulation region, and varies the optical power of the light emitted from the modulation region according to the second amplitude-varying signal of the system end, so that the second branch of information is loaded onto the light, thus providing the solution to loading two branches of information onto a single output of the optical module.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An optical module, comprising:
    a laser device comprising an emission region, and a modulation region to which light emitted by the emission region is transmitted;
    a bias circuit connected with the emission region, the bias circuit configured to drive the emission region to emit light at stable optical power;
    a modulation circuit connected with the modulation region, the modulation circuit configured to drive the modulation region according to a first amplitude-varying signal received from a system end, so that the modulation region varies the optical power of the light emitted from the emission region in correspondence with the first amplitude-varying signal; and
    a semiconductor optical amplifier configured to receive the light from the modulation region, and to vary the optical power of the light emitted from the modulation region in correspondence with a second amplitude-varying signal received from the system end, the system end comprising a device or system configured to generate and output the first amplitude-varying signal and the second amplitude-varying signal to the optical module.

2. The optical module according to claim 1, wherein the modulation circuit converts the first amplitude-varying signal into a first driving signal, and outputs the first driving signal to drive the modulation region.

3. The optical module according to claim 2, wherein the first driving signal is a current signal.

4. The optical module according to claim 2, wherein the first driving signal is a voltage signal.

5. The optical module according to claim 2, further comprising a driving circuit comprising one end connected with the system end, and another end connected with the semiconductor optical amplifier, wherein the driving circuit is configured to drive the semiconductor optical amplifier according to the second amplitude-varying signal transmitted from the system end.

6. The optical module according to claim 5, wherein:
    the driving circuit receives the second amplitude-varying signal from the system end, converts the received second amplitude-varying signal into a second driving signal, and outputs the second driving signal to drive the semiconductor optical amplifier to vary the optical power of the light output by the semiconductor optical amplifier.

7. The optical module according to claim 6, wherein the second driving signal is a current signal.

8. The optical module according to claim 6, wherein the second driving signal is a voltage signal.

9. The optical module according to claim 6, wherein the frequency of the first driving signal is different from the frequency of the second driving signal.

10. The optical module according to claim 9, wherein the frequency of the first driving signal is higher than the frequency of the second driving signal.

11. The optical module according to claim 10, wherein the frequency of the first driving signal is higher than 1 Gbps, and the frequency of the second driving signal is lower than 1 Gbps.

12. The optical module according to claim 1, wherein the frequency of the first amplitude-varying signal is different from the frequency of the second amplitude-varying signal.

13. The optical module according to claim 12, wherein the frequency of the first amplitude-varying signal is higher than the frequency of the second amplitude-varying signal.

14. The optical module according to claim 13, wherein the frequency of the first amplitude-varying signal is higher than 1 Gbps, and the frequency of the second amplitude-varying signal is lower than 1 Gbps.

15. The optical module according to claim 1, wherein the first amplitude-varying signal and the second amplitude-varying signal are generated by the system end by converting different information into two branches of different electrical signals.

16. An optical signal output system, comprising:
a system end configured to generate and output a first amplitude-varying signal and a second amplitude-varying signal; and
an optical module, the optical module comprising:
a laser device comprising an emission region, and a modulation region to which light emitted by the emission region is transmitted;
a bias circuit connected with the emission region, the bias circuit configured to drive the emission region to emit light at stable optical power;
a modulation circuit connected with the modulation region, the modulation circuit configured to drive the modulation region according to the first amplitude-varying signal received from the system end, so that the modulation region varies the optical power of the light emitted from the emission region in correspondence with the first amplitude-varying signal; and
a semiconductor optical amplifier configured to receive the light from the modulation region, and to vary the optical power of the light emitted from the modulation region in correspondence with the second amplitude-varying signal received from the system end.

17. The optical signal output system according to claim 16, wherein the system end converts different information into two different electrical signals to obtain the first amplitude-varying signal and the second amplitude-varying signal.

18. The optical signal output system according to claim 16, wherein the system end includes at least one of a switch, an optical network element set-top box, and an optical line terminal set-top box.

19. The optical signal output system according to claim 16, wherein an amplitude of the first amplitude-varying signal varies periodically, so that the modulation region varies the optical power of the light emitted from the emission region periodically according to the first amplitude-varying signal; and
an amplitude of the second amplitude-varying signal varies periodically, so that the semiconductor optical amplifier varies the optical power of the light emitted from the modulation region periodically according to the second amplitude-varying signal.

20. The optical signal output system according to claim 19, wherein the amplitude of the first amplitude-varying signal varies alternately between a high amplitude and a low amplitude; and
the amplitude of the second amplitude-varying signal varies alternately between a high amplitude and a low amplitude.

* * * * *